(12) United States Patent
Wang et al.

(10) Patent No.: US 8,822,347 B2
(45) Date of Patent: Sep. 2, 2014

(54) WET SOLUBLE LITHOGRAPHY

(75) Inventors: Chien-Wei Wang, Wufong Township, Taichung County (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 413 days.

(21) Appl. No.: 12/430,614

(22) Filed: Apr. 27, 2009

(65) Prior Publication Data

US 2010/0273321 A1    Oct. 28, 2010

(51) Int. Cl.
*H01L 21/302* (2006.01)
*H01L 21/461* (2006.01)

(52) U.S. Cl.
USPC ................... 438/745; 257/E21.219

(58) Field of Classification Search
USPC ........... 438/745; 257/E21.219; 430/325, 330, 430/394
See application file for complete search history.

(56) References Cited

U.S. PATENT DOCUMENTS

| | | | |
|---|---|---|---|
| 6,024,887 A | 2/2000 | Kuo et al. | |
| 6,077,966 A | 6/2000 | Matsumura et al. | |
| 6,416,933 B1 | 7/2002 | Singh et al. | |
| 6,428,852 B1 * | 8/2002 | Pillion et al. | 427/346 |
| 7,959,818 B2 * | 6/2011 | Jung | 216/46 |
| 2004/0185382 A1 | 9/2004 | Byun et al. | |
| 2005/0164133 A1 * | 7/2005 | Rangarajan et al. | 430/322 |
| 2006/0134547 A1 * | 6/2006 | Huang et al. | 430/270.1 |
| 2006/0281320 A1 * | 12/2006 | Lin et al. | 438/701 |
| 2007/0009830 A1 * | 1/2007 | Huang et al. | 430/270.1 |
| 2007/0037410 A1 * | 2/2007 | Chang et al. | 438/780 |
| 2007/0048675 A1 * | 3/2007 | Chang et al. | 430/314 |
| 2007/0243773 A1 * | 10/2007 | Phenis et al. | 439/892 |
| 2007/0248916 A1 | 10/2007 | Kamijima | |
| 2008/0032508 A1 * | 2/2008 | Chang | 438/725 |
| 2008/0076060 A1 * | 3/2008 | Fedynyshyn | 430/270.1 |
| 2008/0199814 A1 * | 8/2008 | Brzozowy et al. | 430/312 |
| 2008/0280230 A1 | 11/2008 | Chang et al. | |
| 2009/0011374 A1 * | 1/2009 | Chang et al. | 430/323 |
| 2009/0087786 A1 * | 4/2009 | Hatakeyama | 430/285.1 |
| 2009/0142701 A1 * | 6/2009 | Hsu et al. | 430/296 |
| 2009/0148789 A1 * | 6/2009 | Amara et al. | 430/270.1 |
| 2010/0009132 A1 * | 1/2010 | Cheng et al. | 428/195.1 |
| 2010/0040838 A1 * | 2/2010 | Abdallah et al. | 428/195.1 |

(Continued)

FOREIGN PATENT DOCUMENTS

| | | |
|---|---|---|
| CN | 1089369 | 7/1994 |
| CN | 1457504 | 11/2003 |

OTHER PUBLICATIONS

Ko Noguchi et al., "Plasma-Induced Gate Oxide Degradation and It's Impact On Oxide Reliability for CMOS FETs", 0-8194-1667-3/94/ $6.00, SPIE vol. 224 / 203-213.

(Continued)

*Primary Examiner* — Daniel Luke
*Assistant Examiner* — Latanya N Crawford
(74) *Attorney, Agent, or Firm* — Haynes and Boone, LLP

(57) ABSTRACT

A system to form a wet soluble lithography layer on a semiconductor substrate includes providing the substrate, depositing a first layer comprising a first material on the substrate, and depositing a second layer comprising a second material on the substrate. In an embodiment, the first material comprises a different composition than the second material and one of the first layer and the second layer includes silicon.

20 Claims, 5 Drawing Sheets

Wet soluble Si containing litho layers – Reversed layer

(56) References Cited

U.S. PATENT DOCUMENTS

2010/0151209 A1* 6/2010 Wei et al. .................. 428/189
2011/0008968 A1* 1/2011 Chang ....................... 438/703
2012/0223051 A1* 9/2012 Millward .................... 216/49

OTHER PUBLICATIONS

Francis Houlihan et al., "Second Generation Radiation Sensitive Developable Bottom Anti Reflective Coatings (DBARC) and Implant Resists Approaches for 193nm Lithography", Advances in Resist Materials and Processing Technology XXIV, edited by Qinghuang Lin Proc. of SPIE vol. 6519, 65190L, (2007), 8 pages.

Seokbin Yu et al., "Residue Formation in The Removal of Ion Implanted Photoresist", Journal of the Korean Physical Socity, vol. 33, No. , Nov. 1998, pp. S80-S83.

Chinese Patent Office, Office Action dated Aug. 25, 2011, Application No. 200910225445.9, 8 pages.

* cited by examiner

WET SOLUBLE LITHOGRAPHY

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also requires associated improvements in semiconductor manufacturing and processing equipment.

One process commonly used in semiconductor manufacturing is applying a photoresist layer to the semiconductor device during manufacturing. A photoresist may be positive or negative and is generally known as a light-sensitive material used in photolithography to form a patterned coating on a surface of the semiconductor device. This patterned coating allows processes, such as conventional implantation processes to implant various dopants in the applied patterns onto the semiconductor substrate/wafer. After these implantation processes, the photoresist is generally removed using one or more dry etching (e.g., ashing, plasma etching ($O_3$, $CF_4$, etc.) and/or wet etching (e.g., Caros' clean, $H_2SO_4/H_2O_2$, etc.) processes. It has been observed that conventional implantation processes result in organic photoresist hardening due to a C—C bond formation (e.g., bond energy ~350 kJ/mol), leaving a carbon crust that cannot dissolve in most solvents and is thus very difficult to remove. Another problem is that the dry etching process generally damages the substrate (e.g., oxide loss), thereby causing the semiconductor device to suffer from reduced electric performance, lower yield productivity, and higher cost of manufacturing. Wet etching alone could prevent the substrate damage, but traditional wet etching methods leave crosslinking carbonized photoresist (PR) crust particles on the substrate. These particles can also negatively influence the electrical performance of the semiconductor device.

Accordingly, what is needed is a method that addresses the above-stated issues.

SUMMARY

Embodiments of the present disclosure relate to a system and method to form a wet soluble lithography layer. In an embodiment, a system to form a wet soluble lithography layer on a semiconductor substrate includes providing the substrate, depositing a first layer comprising a first material on the substrate, and depositing a second layer comprising a second material on the substrate. In an embodiment, the first material comprises a different composition than the second material and one of the first layer and the second layer includes silicon.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

Following are brief descriptions of exemplary drawings. They are mere exemplary embodiments and the scope of the present disclosure should not be limited thereto.

DETAILED DESCRIPTION

Figure 1:
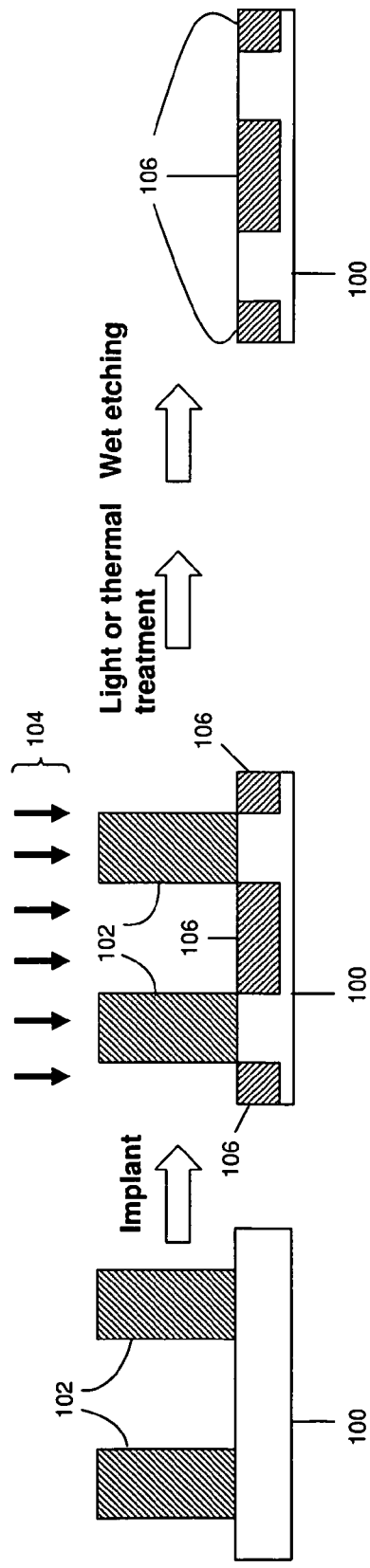
FIG. 1 illustrates a cross-sectional view of an image layer of an embodiment of a semiconductor device being fabricated using a wet soluble lithography layer.

The present disclosure relates generally to manufacturing a semiconductor device, and more particularly, to wet soluble lithography for manufacturing a semiconductor device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A wet soluble lithography system and method is disclosed for use in manufacturing a semiconductor device. The terms lithography, photolithography and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive chemical (e.g., photoresist, or simply "resist") on the substrate. A series of chemical treatments then engrave the exposure pattern into the material underneath the photoresist. In a complex integrated circuit (for example, a modern complimentary metal-oxide semiconductor (CMOS)), a substrate wafer may go through the photolithographic cycle a number of times. In photolithography, the etching resist may be created by exposing it to light, either using a projected image or an optical mask. In other words, this step is similar to a high precision version of the method used to make printed circuit boards. Subsequent stages in the process may relate more to etching than to lithographic printing. Lithography may be used because it allows better control over the shape and size of the objects it creates, and because it can create patterns over an entire surface simultaneously.

Semiconductor photolithography typically includes the process steps of applying a layer of photoresist on a top surface of a semiconductor substrate and exposing the photoresist to a pattern. A post-exposure bake (PEB) is often performed to allow the exposed photoresist polymers to cleave. The substrate including the cleaved polymer photoresist is then transferred to a developing chamber to remove the exposed photoresist, which is soluble to an aqueous developer solution. Traditionally, a developer solution such as tetramethyl ammonium hydroxide (TMAH) is applied to the resist surface in the form of a puddle to develop the exposed photoresist. TMAH may be applied using a puddle process. A de-ionized (DI) water rinse is then applied to the substrate to remove the dissolved polymers of the photoresist. The substrate is then sent to a spin dry process. This process generally makes the patterned photoresist features on the substrate and may be referred to as masking. In other words, masking provides that part of the substrate is protected and part is exposed. Then, the exposed part is manipulated in some way, such as doping or ion implantation. The methods of the present disclosure may be performed after portions of the photoresist have been removed to form the patterned photoresist.

In an embodiment, the radiation beam used to expose the substrate wafer may be ultraviolet and/or can be extended to include other radiation beams such as ion beam, x-ray, extreme ultraviolet, deep ultraviolet, and other proper radiation energy. This radiation beam may have a 'pattern' to expose upon the substrate that the radiation beam gets from being passed through the photomask. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. For manufacturing semiconductor devices, ion implantation or other processes may be performed on the substrate to implant dopants into the exposed parts of the substrate.

In an embodiment, a wet soluble silicon (Si) material (e.g., siloxane, silanol, silane, and a variety of other materials) that comprises at least one Si—O formation can be dissolved in a basic or neutral solution. Thus, the stripping process may be environmentally friendly (e.g., using the DI rinse process). It should be understood that the solubility depends on thermal heating, light illumination, and chemical bombardment (e.g., Si—Si bond energy ~180 kJ/mol). As such, a wet soluble silicon material used as a photoresist layer in semiconductor manufacturing and stripped using a wet process may reduce and prevent substrate damage, thereby reducing the losses and the cost of manufacturing/ownership for the semiconductor device. In an embodiment, the present disclosure may apply to DBARC usage. A person having ordinary skill in the art should understand that using a wet soluble photoresist process, as provided in the present disclosure, will provide bottom layer N, K control (thereby reducing implant photoresist swing), improved implant resistance and remove tool fall on particle for manufacturing a semiconductor device.

It is to be understood that the present disclosure provides for 1) forming wet soluble and silicon containing lithography layers; 2) exposing the wet soluble and silicon containing lithography layers; 3) transferring an image layer pattern to the wet soluble and silicon containing lithography layers; 4) ion implanting both the image layer and the wet soluble and silicon containing lithography layers or the wet soluble and silicon containing lithography layers only; and 5) wet stripping the wet soluble and silicon containing lithography layers.

Embodiments of the present disclosure may be used for a variety of semiconductor process flows, including, but not limited to, sacrificial layer applications and reversed layer applications. Embodiments of the sacrificial layer application may include 1) forming wet soluble and silicon containing lithography layers; 2) forming an image layer; 3) exposing the wet soluble and silicon containing and image layers; 4) forming the image layer pattern; 5) in situ or ex situ transferring the image layer pattern to wet soluble and silicon containing lithography layers; 6) ion implanting; 7) removing the image layer; and 8) wet stripping the image and wet soluble silicon containing lithography layers. Embodiments of the reversed layer application may include 1) forming an image layer; 2) exposing the image layer; 3) forming the image layer pattern; 4) forming the wet soluble and silicon containing lithography layers on the image layer; 5) etching back the silicon containing lithography layers; 6) removing the image layer and reverse the pattern to wet soluble and silicon containing lithography layers; 7) ion implanting; 8) wet stripping the wet soluble and silicon containing lithography layers.

FIG. 1 illustrates a cross-sectional view of an image layer of an embodiment of a semiconductor device being fabricated using a wet soluble lithography layer 102 applied to a substrate 100. In an embodiment, the wet soluble lithography layer 102 includes silicon (Si). The substrate 100 may be a wafer material comprising silicon or a silicon substance. The substrate 100 may comprise an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the substrate may be a semiconductor on insulator, such as a silicon on insulator (SOI), or a thin film transistor (TFT). In some examples, the substrate may include a doped epi layer or a buried layer. In other examples, the compound semiconductor substrate may have a multilayer structure, or the silicon substrate may include a multilayer compound semiconductor structure. In some examples, the substrate may comprise a non-semiconductor material, such as glass.

The Si containing image layer 102 may be coated on the substrate 100 by spin-on coating, vapor deposition, chemical vapor deposition (CVD), plasma enhanced chemical vapor deposition (PECVD), atomic layer deposition (ALD), physical vapor deposition (PVD), high density plasma CVD (HD-PCVD), other suitable methods, and/or combinations thereof. The application of the Si containing image layer 102 may be followed by an in situ or ex situ baking process. After a pattern exposure and post-exposure bake (PEB) process the image layer 102 (e.g., photoresist) may produce an acid and thus increase or decrease its solubility to water after contact to a basic solution developer. The solubility may be increased for positive tone resist and decreased for negative tone resist. In an embodiment, the basic solution developer is an approximately 2.38% tetramethylammonium hydroxide (TMAH) developer solution. However, other concentration levels of the TMAH may be used. TMAH is generally known as a strong base of a quaternary ammonium salt having a molecular formula of $(CH_3)_4NOH$. TMAH may be used as an anisotropic etching of silicon, such as the substrate 100. TMAH may also be used as a basic solvent in the development of acidic photoresist in photolithography processes. The TMAH is generally effective in stripping the photoresist layer because it is a phase transfer catalyst. In addition, the TMAH may be used as a surfactant in the synthesis of ferrofluid to prevent agglomeration.

A photoresist pattern is formed over the substrate 100 using the Si containing image layer 102. The formed Si containing image layer 102 and the exposed substrate 100 are then bombarded by implant ions 104, thereby creating implanted areas 106 in the substrate 100. The implant ions 104 may comprise at least one of As, P, N, B, C, and/or Ge atoms. After the ion implant 104, the Si containing image layer 102 may then be optionally treated with thermal heating or light illumination to change its solubility to a stripping solution. The Si containing image layer 102 is then wet etched away from the substrate 100 by the stripper solution, thereby leaving the substrate 100 having the implanted areas 106. In an embodiment, the stripper solution includes at least an aqueous, organic, or mixed aqueous-organic solvent. The stripping solution may further comprise an acid (e.g., HCl, $H_2SO_4$, phosphoric acid, HF), a base (e.g., TMAH, ammonia), an oxidant (e.g., $H_2O_2$), and/or a surfactant.

Figure 2:
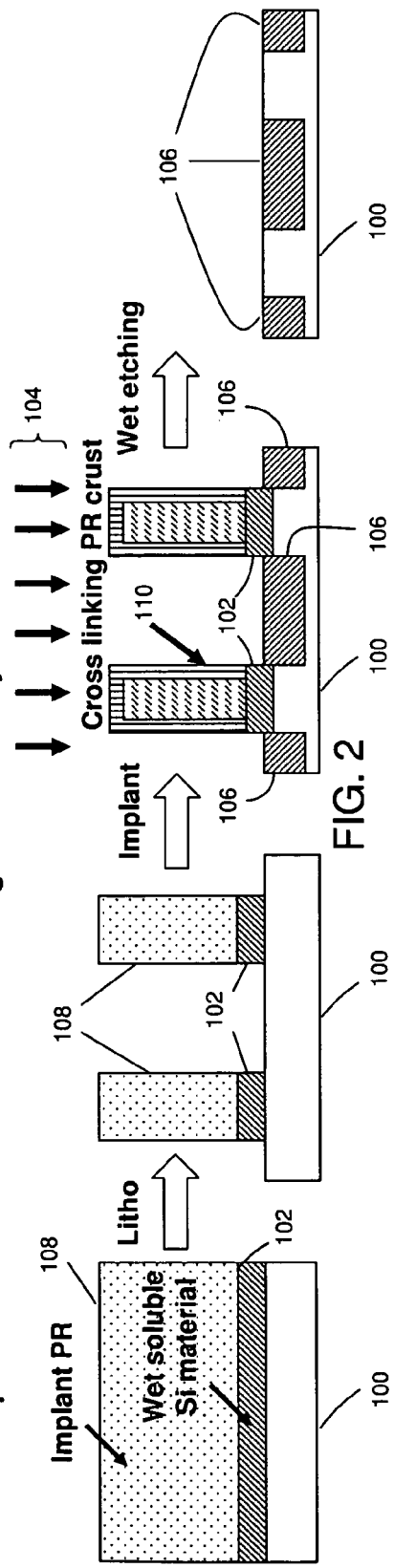
FIG. 2 illustrates a cross-sectional view of an embodiment for an in situ sacrificial layer in semiconductor device fabrication using a wet soluble lithography layer.
Figure 3:
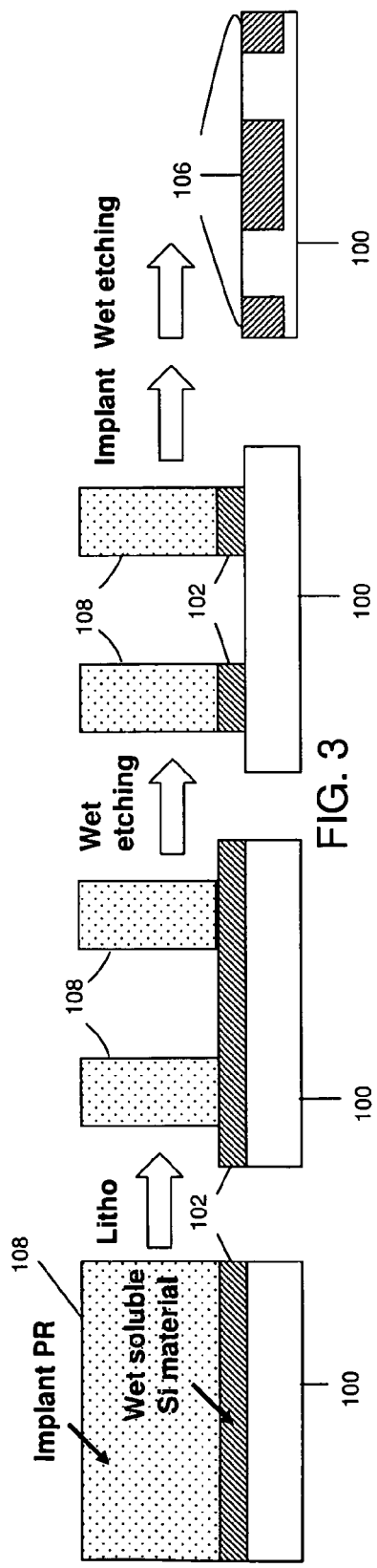
FIG. 3 illustrates a cross-sectional view of an embodiment for an ex situ sacrificial layer in semiconductor device fabrication using a wet soluble lithography layer.

FIG. 2 illustrates a cross-sectional view of an embodiment for an in situ (e.g., inside a process reactor) sacrificial layer in semiconductor device fabrication using a wet soluble lithography layer. FIG. 3 illustrates a cross-sectional view of an embodiment for an ex situ (e.g., outside a process reactor) sacrificial layer in semiconductor device fabrication using a wet soluble lithography layer. In the embodiments shown in FIGS. 2 and 3, a sacrificial Si containing layer 102 is applied to the substrate 100. An implant photoresist layer 108 is applied above the sacrificial layer 102.

The embodiment shown in FIG. 2 provides for both the wet soluble Si containing sacrificial layer 102 and the implant photoresist layer 108 to be patterned above the substrate 100 using a lithography process in situ. After the lithography process in FIG. 2, the patterned Si containing image layer 102, the implant photoresist layer 108, and the exposed substrate 100 are then bombarded by implant ions 104, thereby creating implanted areas 106 in the substrate 100. The implant ions 104 may comprise at least one of As, P, N, B, C, and/or Ge atoms. In addition, the ion implanting 104 creates a crosslinking photoresist crust 110 on the exposed portions of the implant photoresist layer 108. As should be understood by a person having ordinary skill in the art, the sacrificial Si containing layer 102, the implant photoresist layer 108 and the crosslinking photoresist crust 110 are removed from the substrate 100 by wet etching. In short, the implant photoresist layer 108 with wet soluble Si containing sacrificial layer 102 comprises the wet soluble Si containing material underlying the implant photoresist layer 108, and the litho pattern was in situ transferred to the Si containing layer 102. After the implant bombardment 104, the Si containing layer 102 was removed by the wet rinse.

In the embodiment shown in FIG. 3, the implant photoresist layer 108 may be patterned above the substrate 100 and the sacrificial Si containing layer 102 using a lithography process in situ. Then, a wet etching process is used ex situ to pattern the sacrificial Si containing layer 102 above the substrate. After the lithography process and the first wet etching process in FIG. 3, the patterned Si containing image layer 102, the implant photoresist layer 108 and the exposed substrate 100 are then bombarded by implant ions 104, thereby creating implanted areas 106 in the substrate 100. The implant ions 104 may comprise at least one of As, P, N, B, C, and/or Ge atoms. As should be understood by a person having ordinary skill in the art, the sacrificial Si containing layer 102 and the implant photoresist layer 108 are removed from the substrate 100 by wet etching. In other words, the implant photoresist layer 108 with wet soluble Si containing sacrificial layer 102 comprise the wet soluble Si containing material underlying the implant photoresist layer 108, and the litho pattern was ex situ transferred to the Si containing layer 102. After the implant bombardment 104, the Si containing layer 102 was removed by the wet rinse.

Figure 4:
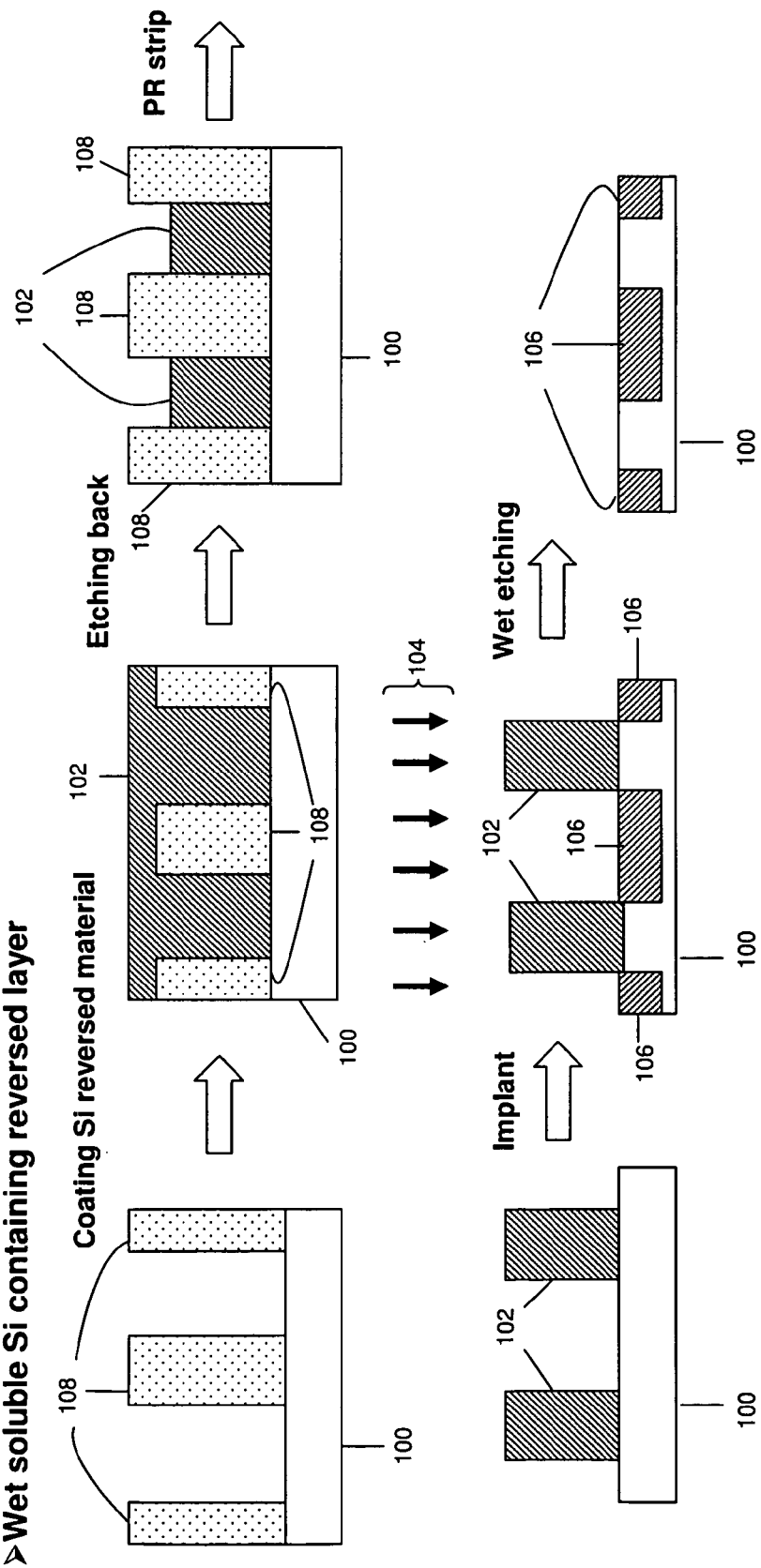
FIG. 4 illustrates a cross-sectional view of a reversed layer of an embodiment of a semiconductor device being fabricated using a wet soluble lithography layer.

FIG. 4 illustrates a cross-sectional view of a reversed layer of an embodiment of a semiconductor device being fabricated using a wet soluble lithography layer. In this embodiment, an implant photoresist layer 108 is applied above the substrate 100. Then, a wet soluble Si containing layer 102 comprising a wet soluble Si containing material is layered above the patterned implant photoresist layer 108 and the exposed areas of the substrate 100. Then, the wet soluble Si containing layer 102 is etched back to expose the patterned implant photoresist layer 108. The implant photoresist layer 108 is then stripped from the substrate 100. By stripping the implant photoresist layer 108, the litho pattern is transferred, in reverse, to the Si containing layer 102. Then, the patterned Si containing image layer 102 and the exposed substrate 100 are then bombarded by implant ions 104, thereby creating implanted areas 106 in the substrate 100. The implant ions 104 may comprise at least one of As, P, N, B, C, and/or Ge atoms. As should be understood by a person having ordinary skill in the art, the reversed Si containing layer 102 is removed from the substrate 100 by wet etching.

Figure 5:
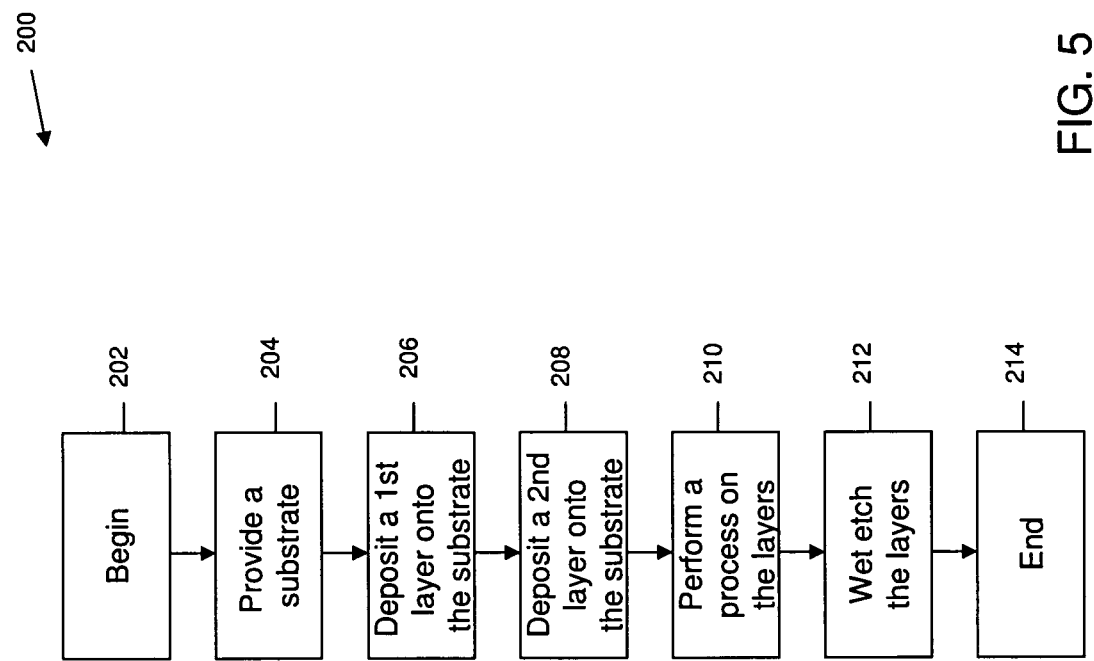
FIG. 5 illustrates a flow chart of an embodiment of a method to process an integrated circuit using a wet soluble lithography layer.

FIG. 5 illustrates a flow chart of an embodiment of a method 200 to process an integrated circuit device, such as those shown in FIGS. 1-4, using a wet soluble lithography layer. In an embodiment, the wet soluble lithography layer comprises silicon. The method 200 begins at block 202 where the manufacturer provides a substrate (e.g., substrate 100). In an embodiment, the substrate includes silicon semiconductor material. The method 200 then proceeds to block 204 where the manufacturer deposits a first layer onto the substrate. Then, the method 200 proceeds to block 206 where the manufacturer deposits a second layer onto the substrate. As discussed above, one or more of the layers deposited on the substrate may include a wet soluble Si containing material. The method 200 then proceeds to block 208 where a process is performed on the layers and/or the substrate. This process may include any number of processes and may be in situ and/or ex situ. Examples of processes may be patterning the layers, etching the layers, light or thermal treating the layers and/or the substrate. The layers may be patterned using lithography, etching or other processes, as should be understood by those having ordinary skill in the art. After performing a process on the layers (e.g., patterning the layers), ion implantation may be performed on the layers and the substrate. Then, the method 200 proceeds to block 210 where the wet soluble Si containing material is wet etched from the substrate and the method 200 ends at block 214. It is to be understood that the wet soluble Si containing material may be wet etched from the substrate without damage to the substrate after the ion implantation.

Figure 6:
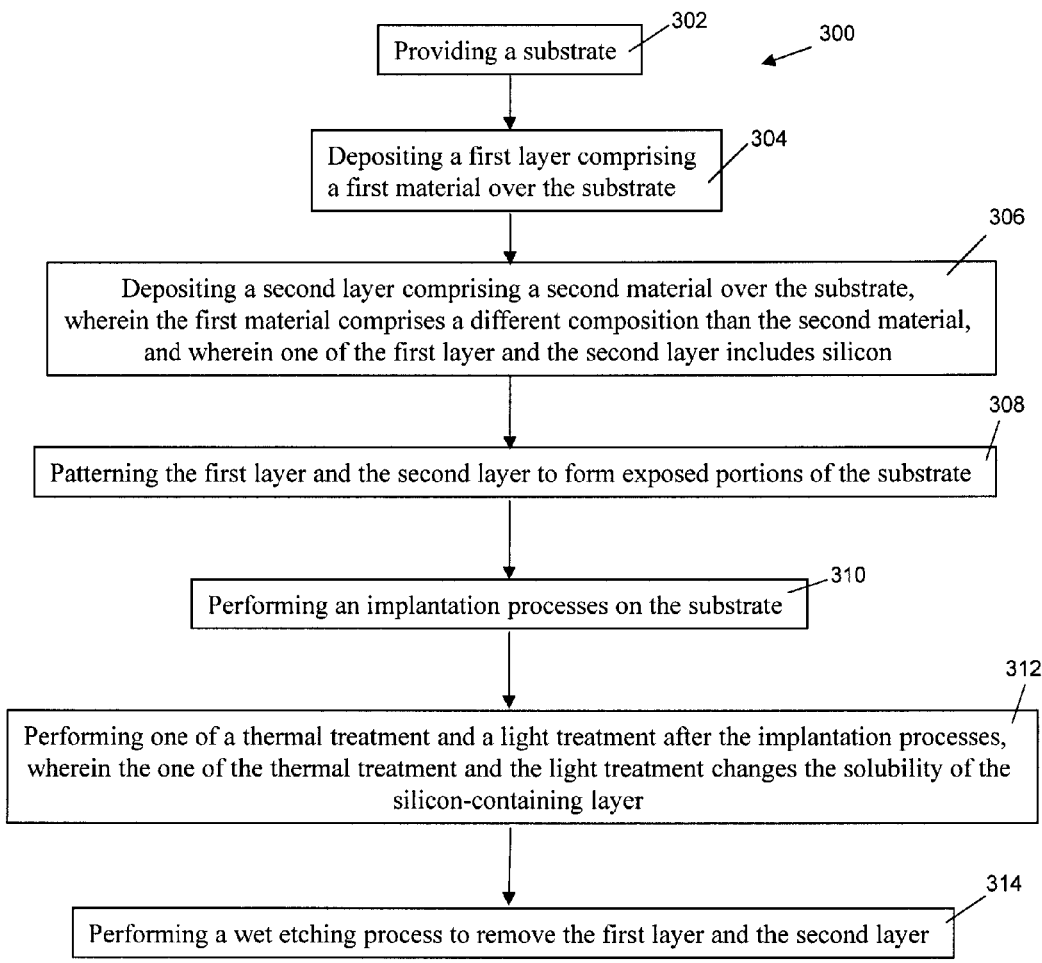
FIG. 6 illustrates a method 300 for fabricating an integrated circuit device.

FIG. 6 illustrates a method 300 for fabricating an integrated circuit device. The method begins at block 302 by providing a substrate. Block 304 discloses depositing a first layer comprising a first material over the substrate. Block 306 discloses depositing a second layer comprising a second material over the substrate, wherein the first material comprises a different composition than the second material, and wherein one of the first layer and the second layer includes silicon. Block 308 discloses patterning the first layer and the second layer to form exposed portions of the substrate. Block 310 discloses performing an implantation processes on the substrate. Block 312 discloses performing one of a thermal treatment and a light treatment after the implantation processes, wherein the one of the thermal treatment and the light treatment changes the solubility of the silicon-containing layer. Block 314 discloses performing a wet etching process to remove the first layer and the second layer.

It is to be understood that the wet soluble Si containing material could be non-cross linkable, linker bonded cross linkable or cross linkable material with additional linker. The crosslinker may be tuned to solvency of the wet soluble Si containing material. Examples of embodiments of a wet soluble Si containing material are as follows:
 1. silane, siloxane, alkylsilane, and alkylalkoxylsilane (for example, $R_1R_2R_3R_4Si$);
 2. amindo(silane, siloxane, alkylsilane, alkylalkoxylsilane) (for example, $(R_1R_2R_3)(NR_5R_6R_7)Si$, $(R_1R_2)(NR_5R_6R_7)(NR_8R_9R_{10})Si$, $R1(NR_5R_6R_7)(NR_8R_9R_{10})(NR_{11}R_{12}R_{13})Si$, and/or $(NR_5R_6R_7)(NR_8R_9R_{10})(NR_{11}R_{12}R_{13})(NR_{14}R_{15}R_{16})Si$; and/or
 3. Si—Si bond containing (amindo or non-amindo (silane, siloxane, alkylsilane, alkylalkoxylsilane)) (for example, $(R_{13}R_{14}R_{15})Si((R_{16}R_{17})Si)n)$.

Examples of embodiments of a crosslinker are as follows:
 1. amine: $(R_{18}R_{19}R_{20})N$;
 2. aminol: $(R_{18}R_{19})NCOH$;
 3. epoxyl: $R_{18}O$;
 4. alcohol: $R_{18}OH$;
 5. carboxylic acid: $R_{18}COOH$;
 6. ester: $R_{18}COOR_{19}$;
 7. anhydride: $R_{18}COOCOR_{19}$;
 8. lactone: $R_{18}COO$;
 9. halide: RX; and/or
 10. Si—O bond containing materials.

As should be also understood by a person having ordinary skill in the art, R1-R24 may be an H, OH, alkyl chain which may further contain amine, amido, aminol, epoxy, alcohol, Si—O, halogen, carboxylic group, and/or combinations thereof.

Embodiments of the present disclosure provide for systems and methods for forming a wet soluble and Si containing lithography layers on a substrate during semiconductor manufacturing, optionally forming an organic image layer, optionally exposing the organic image layer and wet soluble Si containing lithography layers, forming the wet soluble image using Si containing lithography layers or a reverse of the organic image layer pattern to the Si containing lithography layers, ion implanting both the organic image layer and the wet soluble Si containing lithography layers or the wet soluble Si containing litho layers only, and wet stripping the wet soluble and Si containing lithography layers. It should be apparent to a person having ordinary skill in the art that the present disclosure may provide one or more advantages, such as reduces substrate damage, reduces cost of ownership/manufacturing, provides bottom layer refractive index (N) and extinction coefficient (K) control, reduces photoresist swing, improves implant resistance, allows for a tunable dissolution rate, allows for conventional spin-coating, and improves removing fall on particle defects. It is understood that the embodiments disclosed may have different advantages than those noted herein and that no one embodiment requires any particular advantage.

Embodiments of the present disclosure provide for a method for forming a Si containing lithography layer on a semiconductor substrate. The method comprises depositing a first material layer to the substrate, depositing at least a second material layer on top of the first material layer, wherein the first material layer and second material layer contain different compositions of material. The first and/or the second layer may contain Si. The first or the second layer may be a photo imageable layer where the exposure wavelength comprises I-line, KrF, ArF, EUV or E-Beam exposure. The first layer may have a different optical property than the second layer. It is contemplated that the first layer may have a substantially different N, K or T value than second layer. In an embodiment, the first layer comprises at least one of an acid labile molecule, photo acid generator (PAG), quencher, chromophore, cross linker, surfactant, or solvent, which lead to different n value to second layer. In an embodiment, the first and second layer formation are applied using spin coating or vapor deposition wherein the first or the second layer thickness is substantially <300 nm, the environment pressure is substantially less than 2 atm and/or the baking temperature is substantially less than 300° C.

A person having ordinary skill in the art should understand that a PAG is a photosensitive component of photoresist. Light (a photon) decomposes the PAG forming a small amount of acid which induces the chemical transformation of the photoresist that causes it to be soluble/insoluble.

Embodiments of the present disclosure provide for a method for forming a Si containing lithography layer on a semiconductor substrate. The method comprises depositing a first material layer to the substrate, depositing at least a second material layer on top of the first material layer, wherein the first material layer and second material layer contain different compositions of material. The first and/or the second layer may contain Si. In an embodiment, the Si containing layers may be amido or non amido(silane, siloxane, alkylsilane, alkylalkoxylsilane), or SiSi bond containing (amido or non amido(silane, siloxane, alkylsilane, alkylalkoxylsilane)). The Si containing layers may further comprise at least one of the amine, amido, aminol, epoxy, alcohol, halogen, and carboxylic group. In addition, the Si containing lithography layer material may further comprise a cross linker that undergoes a chemical reaction with the Si containing lithography layer material. After the chemical reaction, the Si containing lithography layer material molecular weight will increase and after the molecular weight increases, the Si containing lithography layer material wet solubility changes. It should be understood that the chemical reaction may be triggered by thermal heating or light illumination. In an embodiment, the additional cross linker comprises at least one of the amine, amido, aminol, epoxy, Si—O, alcohol, halogen, and carboxylic group.

Embodiments of the present disclosure provide for a method for forming a Si containing lithography layer on a semiconductor substrate. The method comprises depositing a first material layer to the substrate, depositing at least a second material layer on top of the first material layer, wherein the first material layer and second material layer contain different compositions of material. The first and/or the second layer contains Si and is substantially wet soluble in a wet etching fluid. In an embodiment, the Si containing layer is substantially wet soluble after ion bombardment where the implanted ions comprise at least one of the As, P, B, N, C and Ge atoms. The wet etching fluid may comprise a solvent, or a chemical. The solvent may comprise NMP, PGME, PGMEA, H₂O, DMSO or the like. The chemical may comprise an acid, a base, an oxidant, a reductant and/or a surfactant. The acid may comprise HCl, $H_2SO_4$, $HNO_3$, HF, or phosphoric acid. The base may comprise ammonia, TMAH or the like. The oxidant may compose $H_2O_2$, $HNO_3$ or $O_3$ or other suitable materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a wet soluble lithography layer on a substrate, the method comprising:
   providing the substrate;
   depositing a first layer comprising a first material on the substrate, the first layer includes silicon;
   depositing a second layer comprising a second material over the first layer, wherein the first material comprises a different composition than the second material;
   after depositing the second layer comprising the second material over the first layer, performing an implantation process on the substrate; and
   performing one of a thermal treatment and a light treatment after performing the implantation process, wherein the one of the thermal treatment and the light treatment changes the solubility of the first layer.

2. The method of claim 1, wherein the second layer comprises a photosensitive layer.

3. The method of claim 1, wherein depositing the first layer over the substrate and depositing the second layer over the substrate comprises one of a spin-coating process, a vapor deposition process, and combinations thereof.

4. The method of claim 1, wherein the first layer or the second layer comprises a thickness of less than approximately 300 nanometers.

5. The method of claim 1 further comprising baking the first or second layers at a temperature of less than approximately 300° C.

6. The method of claim 1, wherein the second layer comprises one of an acid labile molecule, a photoacid generator (PAG), a quencher, a chromophore, a crosslinker, surfactant, and solvent.

7. The method of claim 1, further comprising:
   patterning the first layer and the second layer;
   wherein performing the implantation process on the substrate includes performing the implantation process on the patterned first and second layers; and
   wherein performing one of the thermal treatment and the light treatment on the patterned first layer includes the one of the thermal treatment and the light treatment changing the solubility of the patterned first layer.

8. A method of using a wet soluble lithography layer on a substrate, the method comprising:
   providing the substrate;
   forming a patterned first layer comprising a first material on the substrate, the patterned first layer having an opening exposing the substrate;
   forming a second layer comprising a second material over the patterned first layer such that the second material is disposed within the opening, wherein the first material comprises a different composition than the second material, and wherein the second layer includes silicon;
   performing a light treatment on the second layer, wherein the light treatment changes the solubility of the second layer; and
   removing the patterned first layer using wet etching resulting in a patterned second layer.

9. The method of claim 8, wherein the second layer including silicon comprises one of an amido, non-amido, and Si—Si bond containing material;
   wherein the one of the amido, non-amido, and/or Si—Si bond containing material comprises one of silane, siloxane, alkylsilane, and alkylalkoxylsilane.

10. The method of claim 8, wherein the second layer including silicon includes one of amine, amido aminol, epoxy, alcohol, halogen, and carboxylic group.

11. The method of claim 8, wherein the second layer including silicon comprises a crosslinker.

12. The method of claim 11, wherein the crosslinker undergoes a chemical reaction with the layer including silicon.

13. The method of claim 12, wherein the second layer including silicon increases in molecular weight after the chemical reaction.

14. The method of claim 13, wherein the second layer including silicon changes wet solubility after the molecular weight increases.

15. The method of claim 8, wherein forming the second layer comprising the second material over the patterned first layer includes:
   depositing the second material over the patterned first layer such that the second material covers the patterned first layer; and
   performing an etching process on the deposited second material to expose a portion of the patterned first layer.

16. The method of claim 8, further comprising:
   performing an implantation process on the substrate using the patterned second layer as an implantation mask; and
   removing the patterned second layer using wet etching.

17. The method of claim 16, wherein performing the light treatment includes performing the light treatment on the patterned second layer prior to performing the implantation process.

18. The method of claim 8, further comprising:
   performing an implantation process on the substrate using the patterned second layer as an implantation mask; and
   wherein performing the light treatment on the second layer occurs after performing the implantation process.

19. A method for fabricating an integrated circuit device, the method comprising:
   providing a substrate;
   depositing a first layer comprising a first material over the substrate;
   depositing a second layer comprising a second material over the substrate, wherein the first material comprises a different composition than the second material, and wherein one of the first layer and the second layer includes a silicon-containing layer;
   patterning the first layer and the second layer to form exposed portions of the substrate;
   performing an implantation processes on the exposed portions of the substrate using the patterned second layer as a mask;
   performing a wet etching process to remove the first layer and the second layer; and performing one of a thermal treatment and a light treatment after the implantation processes, wherein the one of the thermal treatment and the light treatment changes the solubility of the silicon-containing layer.

20. The method of claim 19, wherein performing the wet etching process comprises utilizing one of a solvent and a chemical;

wherein the chemical is one of an acid, a base, an oxidant, a reductant, and a surfactant.

* * * * *